(12) United States Patent
Lv

(10) Patent No.: US 12,211,697 B2
(45) Date of Patent: Jan. 28, 2025

(54) METHOD FOR MANUFACTURING SEMICONDUCTOR STRUCTURE AND SAME

(71) Applicant: CHANGXIN MEMORY TECHNOLOGIES, INC., Hefei (CN)

(72) Inventor: You Lv, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 535 days.

(21) Appl. No.: 17/643,393

(22) Filed: Dec. 8, 2021

(65) Prior Publication Data

US 2023/0012005 A1   Jan. 12, 2023

Related U.S. Application Data

(63) Continuation of application No. PCT/CN2021/120436, filed on Sep. 24, 2021.

(30) Foreign Application Priority Data

Jul. 7, 2021  (CN) .......................... 202110768540.4

(51) Int. Cl.
*H01L 21/308*  (2006.01)
*H01L 21/02*   (2006.01)
(Continued)

(52) U.S. Cl.
CPC ........ *H01L 21/308* (2013.01); *H01L 21/0228* (2013.01); *H01L 21/027* (2013.01); *H01L 29/68* (2013.01)

(58) Field of Classification Search
CPC . H01L 21/308; H01L 21/0228; H01L 21/027; H01L 29/68; H01L 21/76885; H01L 23/528; H01L 21/32139
(Continued)

(56) References Cited

U.S. PATENT DOCUMENTS 10,770,159 B2 *  9/2020  Huang ................... G11C 17/16
2006/0284259 A1* 12/2006  Lee ....................... H10B 12/482
257/365
(Continued)

FOREIGN PATENT DOCUMENTS

CN   103367108 B   10/2015
CN   108878366 A   11/2018
(Continued)

*Primary Examiner* — Duy Vu N Deo
(74) *Attorney, Agent, or Firm* — Syncoda LLC; Feng Ma

(57) ABSTRACT

A method for manufacturing a semiconductor structure includes: providing a base having first contact layers and a second contact layer; forming an initial electrical connection layer; forming a lower mask layer including a first and a second pattern regions, and on an upper surface of the base, orthographic projections of two first contact layers fall within an orthographic projection of one first pattern region, and an orthographic projection of one second contact layer falls within an orthographic projection of one second pattern region; patterning the first pattern region to form two first sub-pattern regions discrete from each other; and etching the initial electrical connection layer to form first electrical connection layers and a second electrical connection layer discrete from each other, in which the first electrical connection layers correspond to the first sub-pattern regions, and the second electrical connection layer corresponds to the second pattern region.

15 Claims, 19 Drawing Sheets

(51) Int. Cl.
*H01L 21/027* (2006.01)
*H01L 29/68* (2006.01)

(58) Field of Classification Search
USPC .......................................................... 216/47
See application file for complete search history.

(56) References Cited

U.S. PATENT DOCUMENTS

2007/0096155 A1* 5/2007 Baek .................. H01L 27/0207
257/E21.658
2017/0271340 A1* 9/2017 Kim .................. H10B 12/0335

FOREIGN PATENT DOCUMENTS

| CN | 109037155 A | 12/2018 |
| CN | 109979939 A | 7/2019 |

\* cited by examiner

METHOD FOR MANUFACTURING SEMICONDUCTOR STRUCTURE AND SAME

CROSS-REFERENCE TO RELATED APPLICATIONS

This is a continuation of International Application No. PCT/CN2021/120436 filed on Sep. 24, 2021, which claims priority to Chinese Patent Application No. 202110768540.4 filed on Jul. 7, 2021. The disclosures of the above-referenced applications are hereby incorporated by reference in their entirety.

BACKGROUND

A memory is a common semiconductor structure. It is a memory part for storing a program and various data information, and generally includes structures such as an active area, a bit line, and a word line. The structures such as the active area, the bit line, or the word line needs to be led out through a contact layer and an electrical connection layer, so as to be connected to a control circuit.

SUMMARY

Embodiments of this disclosure relate to but are not limited to a method for manufacturing a semiconductor structure and the same.

According to the first aspect, an embodiment of this disclosure provides a method for manufacturing a semiconductor structure, including: providing a base, in which at least two first contact layers and at least one second contact layer discrete from each other are provided; forming an initial electrical connection layer, which is electrically connected to the first contact layers and the second contact layer; forming lower mask layers, which include at least one first pattern region and at least one second pattern region discrete from each other, in which the first pattern region is adjacent to the second pattern region, and on an upper surface of the base, orthographic projections of two first contact layers fall within an orthographic projection of one first pattern region, and an orthographic projection of one second contact layer falls within an orthographic projection of one second pattern region; patterning the first pattern region to form two first sub-pattern regions discrete from each other, in which one first sub-pattern region is located between the second pattern region and another first sub-pattern region, and on the upper surface of the base, an orthographic projection of one first contact layer falls within an orthographic projection of one first sub-pattern region; and etching the initial electrical connection layer to form first electrical connection layers and a second electrical connection layer discrete from each other, in which the first electrical connection layers have one-to-one correspondence to the first sub-pattern regions, and the second electrical connection layer has one-to-one correspondence to the second pattern region.

According to the second aspect, an embodiment of this disclosure further provides a semiconductor structure, including a base, in which at least two first contact layers and at least one second contact layer that are discrete from each other are provided; at least two first electrical connection layers and at least one second electrical connection layer discrete from each other on the substrate, in which one first electrical connection layer is located between one second electrical connection layer and another first electrical connection layer. On an upper surface of the substrate, an orthographic projection of each first contact layer falls within an orthographic projection of one first electrical connection layer, an orthographic projection of each second contact layer falls within an orthographic projection of one second electrical connection layer; each first electrical connection layer is electrically connected to one first contact layer; and each second electrical connection layer is electrically connected to one second contact layer.

BRIEF DESCRIPTION OF THE DRAWINGS

One or more embodiments are exemplarily descripted with the figures in the accompanying drawings corresponding thereto, but these exemplary descriptions do not constitute any limitation on the embodiments. Elements having the same reference numerals in the accompanying drawings are denoted as similar elements. Unless specifically stated, the figures in the accompanying drawings do not constitute a limitation of scale.

DETAILED DESCRIPTION

In processes of forming the contact layer and the electrical connection layer, a problem of short circuit is likely to occur inside the semiconductor structure.

Figure 1:
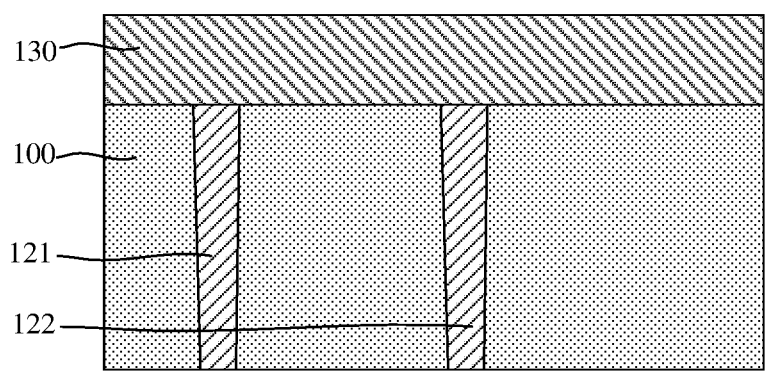
FIG. 1 is a first schematic structural diagram corresponding to operations in a method for manufacturing a semiconductor structure.

FIG. 1 to FIG. 4 are schematic structural diagrams corresponding to operations in a method for manufacturing a semiconductor structure. Referring to FIG. 1, a semiconductor structure includes a base 100, a first contact layer 121 and a second contact layer 122 located in the base 100, and an initial electrical connection layer 130 located on the surface of the base 100. Subsequently, a part of the initial electrical connection layer 130 is etched. Specifically, a patterned mask layer may be formed on the initial electrical connection layer 130, and the initial electrical connection layer 130 is etched by using the patterned mask layer as a mask. Generally, the process of patterning processing is performed twice to form a final patterned mask layer.

Figure 2:
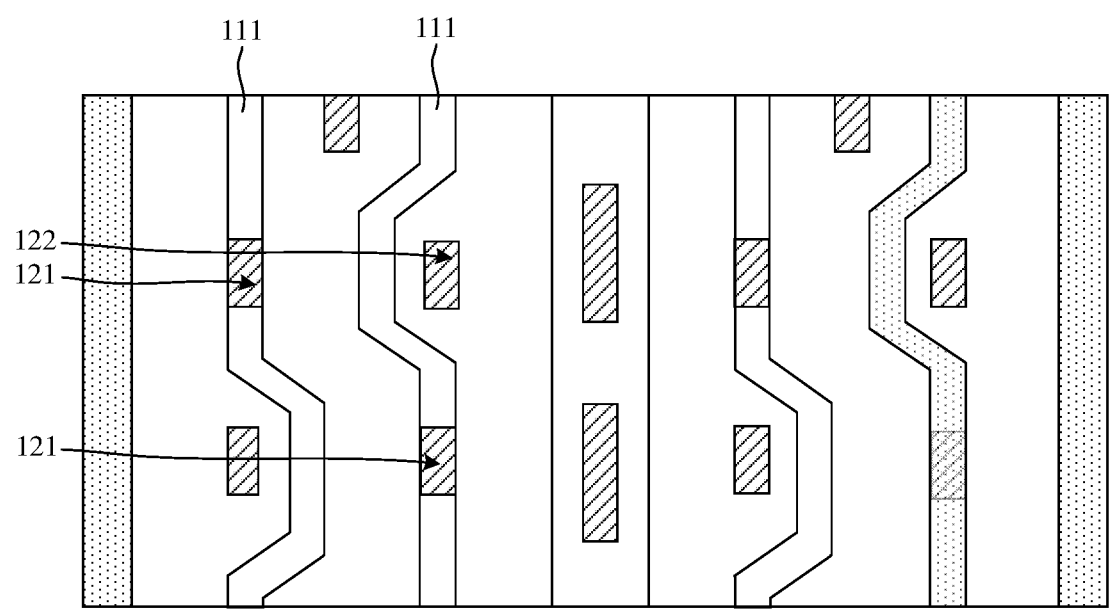
FIG. 2 is a second schematic structural diagram corresponding to operations in a method for manufacturing a semiconductor structure.

Further, referring to FIG. 2, FIG. 2 is the top view of the semiconductor structure subjected to the first patterning processing. After the first patterning processing, at least two first pattern regions 111 discrete from each other are formed. Each first contact layer 121 corresponds to one first pattern region 111.

Figure 3:
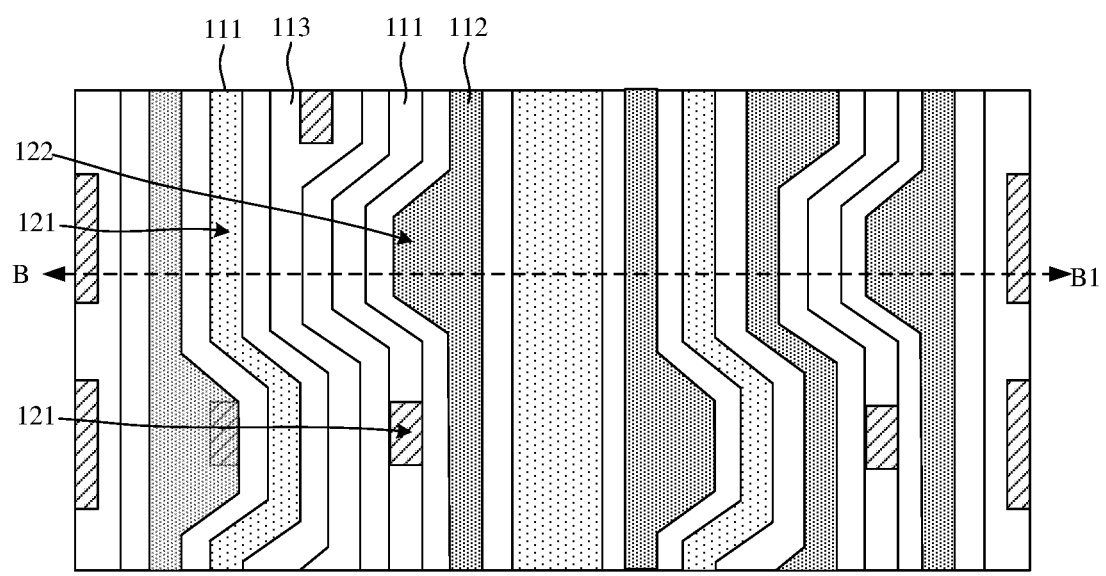
FIG. 3 is a third schematic structural diagram corresponding to operations in a method for manufacturing a semiconductor structure.

Referring to FIG. 3, FIG. 3 is the top view of the semiconductor structure subjected to the second patterning processing. After the second patterning processing, a third pattern region 113 is formed between two first pattern regions 111, and second pattern regions 112 adjacent to each of the first pattern regions 111 are formed. Each second contact layer 122 corresponds to one second pattern region 112.

It can be understood that, because the design sizes of the first pattern regions 111 and the second pattern regions 112 are relatively small, and correspondingly, process windows are also relatively small. In a photolithography process, an interference problem is likely to occur due to a small distance between light beams, and an alignment error is also likely to occur, thereby causing change in actual sizes or actual locations of the first pattern regions 111 and the second pattern regions 112.

Figure 4:
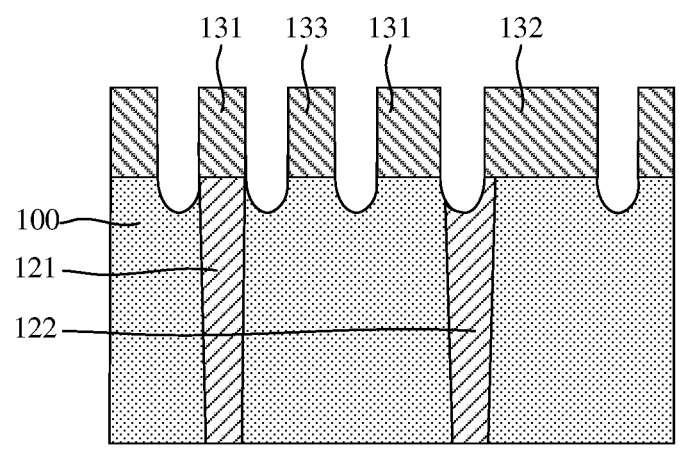
FIG. 4 is a fourth schematic structural diagram corresponding to operations in a method for manufacturing a semiconductor structure.

Referring to FIG. 4, FIG. 4 is a partial cross-sectional view, and the cross-sectional direction is the B-B1 direction shown in FIG. 3. The initial electrical connection layer 130 (referring to FIG. 1) is etched by using the patterned mask layer as the mask, to form first electrical connection layers 131, second electrical connection layers 132, and a third electrical connection layer 133. The first electrical connection layers 131 correspond to the first pattern regions 111 (referring to FIG. 3), the second electrical connection layers 132 correspond to the second pattern regions 112 (referring to FIG. 3), and the third electrical connection layer 133 corresponds to the third pattern region 113 (referring to FIG. 3). A part of the third electrical connection layer 133 that does not work may be subsequently removed.

Because an actual size or an actual location of a first pattern region 111 or a second pattern region 112 is likely to change, the sizes and the locations of the first electrical connection layer 131 and the second electrical connection layer 132 which are adjacent to each other are also likely to change. For example, because the distance between the first electrical connection layer 131 and the second contact layer 122 adjacent thereto is too small, short circuit is likely to occur. In addition, in the process of etching the initial electrical connection layer 130, a part of the second contact layer 122 is also likely to be removed, that is, on the upper surface of the base 100, the orthographic projection of the second contact layer 122 does not completely fall within the orthographic projection of the second electrical connection layer 132, thereby reducing the contact area between the second contact layer 122 and the second electrical connection layer 132, and increasing the contact resistance.

To resolve the foregoing problem, embodiments of this disclosure provides a method for manufacturing a semiconductor structure, including: forming a lower mask layer, in which the lower mask layer includes a first pattern region and a second pattern region discrete from each other; performing segmenting processing to the first pattern region to form two first sub-pattern regions discrete from each other, in which on the upper surface of the base, the orthographic projection of one first contact layer falls within the orthographic projection of one first sub-pattern region; and etching an initial electrical connection layer to form first electrical connection layers and a second electrical connection layer that are discrete from each other, in which the first electrical connection layers correspond to the first sub-pattern regions one-to-one, and the second electrical connection layer correspond to the second pattern region one-to-one. That is, two first sub-pattern regions are merged in the first pattern region. Therefore, the first pattern region has a relatively large process window, so that affections of interference or alignment errors on the sizes and the locations of patterns can be reduced, and a sufficient distance can be reserved for the first electrical connection layers that are prone to short circuit, so as to increase the distance between the second contact layer and the first electrical connection layer adjacent thereto. In addition, the first pattern region is patterned to form two independent first electrical connection layers. That is, in this embodiment of this disclosure, pattern design and the method for forming the first electrical connection layers are optimized, thereby reducing the risk of short circuit in the semiconductor structure.

To make the objectives, technical solutions, and advantages of the embodiments of this disclosure clearer, the following further describes the embodiments of this disclosure in detail with reference to the accompanying drawings. However, a person of ordinary skill in the art can understand that in the embodiments of this disclosure, many technical details are proposed to make readers better understand this disclosure. However, even without these technical details and various changes and modifications based on the following embodiments, the technical solutions claimed in this disclosure can also be implemented.

An embodiment of this disclosure provides a method for manufacturing a semiconductor structure. FIG. 5 to FIG. 19 are schematic structural diagrams corresponding to operations in the method for manufacturing a semiconductor structure provided in this embodiment. Details will be illustrated below with reference to the accompanying drawings.

Figure 5:
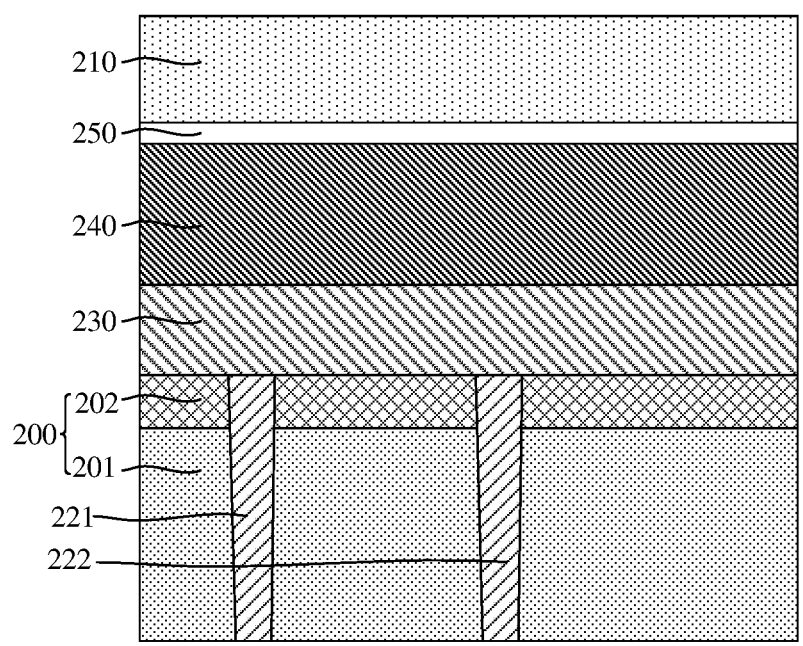
FIG. 5 is a first schematic structural diagram corresponding to operations in a method for manufacturing a semiconductor structure according to embodiments of this disclosure.

Referring to FIG. 5, a base 200 is provided, in which at least two first contact layers 221 and at least one second contact layer 222 discrete from each other are provided in the base 200.

In this embodiment, the base 200 is a double-layer structure, and includes a substrate 201 and a covering layer 202. Materials of the substrate 201 and the covering layer 202 may be insulating materials. For example, the material of the substrate 201 may be silicon oxide, and the material of the covering layer 202 may be silicon nitride. In other embodiments, the base may be a single-layer structure, or a structure with three or more layers. There may also be structures such as active areas, word lines, or bit lines in the base 200, and the structures such as the active areas, the word lines, or the bit lines are electrically connected to the first contact layers 221, the second contact layer 222, or other contact layers.

It is to be noted that FIG. 5 is a partial cross-sectional view of the semiconductor. There is only one first contact layer 221 in the cross section shown in FIG. 5, and there may be another first contact layer 221 in other part of cross section. The first contact layers 221 and the second contact layer 222 are further connected to a subsequently formed control circuit, to implement control to the structures such as the active areas, the word lines, or the bit lines in the base 200.

In this embodiment, materials of the first contact layers 221 and the second contact layer 222 are conductive materials, and are the same, for example, tungsten, copper, or polysilicon. In other embodiments, the materials of the first contact layers and the second contact layer may also be different.

Continuing referring to FIG. 5, the initial electrical connection layer 230 is formed on the base 200. The initial electrical connection layer 230 is electrically connected to the first contact layer 221 and the second contact layer 222.

The initial electrical connection layer 230, the first contact layer 221, and the second contact layer 222 may be formed in the same process, or may be formed in two independent processes. In this embodiment, the initial electrical connection layer 230 is formed by using a physical vapor deposition process. In other embodiments, the initial electrical connection layer may also be formed by using a chemical vapor deposition process.

The material of the initial electrical connection layer 230 is a conductive material, and in this embodiment, the material of the initial electrical connection layer 230 is the same as the material of the first contact layer 221 and the second contact layer 222, for example, tungsten, copper, or polysilicon. In other embodiments, the material of the initial electrical connection layer may also be different from the material of the first contact layer and the second contact layer.

Referring to FIG. 5 to FIG. 14, a lower mask layer 21 is formed on the initial electrical connection layer, the lower mask layer 21 includes at least one first pattern region 211 and at least one second pattern region 212 discrete from each other, and the first pattern region 211 is adjacent to the second pattern region 212. On the upper surface of the base 200, the orthographic projections of two first contact layers 221 fall within the orthographic projection of one first pattern region 211, and the orthographic projection of one second contact layer 222 falls within the orthographic projection of one second pattern region 212.

The lower mask layer 21 is a mask layer for subsequently etching the initial electrical connection layer 230, to form first electrical connection layers and a second electrical connection layer. In addition, the first pattern region 211 will be subsequently segmented into two first sub-pattern regions which respectively correspond to the two subsequently formed first electrical connection layers, and the second pattern region 212 corresponds to the second electrical connection layer. That is, in this embodiment, patterns of the two first electrical connection layers are merged. In this way, the process window of the first electrical connection layers can be enlarged, so that the distance between the second contact layer and the first electrical connection layer adjacent thereto can be increased, and short circuit therebetween can be avoided.

In this embodiment, the lower mask layer 21 is formed by using a dual patterning process. The following describes in detail the operation of forming the lower mask layer 21.

Referring to FIG. 5, a bottom mask layer 240, a stop layer 250 and an initial lower mask layer 210, which are stacked, are formed on the initial electrical connection layer 230.

The bottom mask layer 240 and the stop layer 250 facilitate the improvement of pattern transfer accuracy. The material of the bottom mask layer 240 may be silicon carbide, silicon carbonitride, silicon oxycarbide, or the like, the material of the stop layer 250 may be silicon nitride, silicon oxynitride, or the like, and the material of the initial lower mask layer 210 may be silicon oxide, silicon oxycarbide, or the like. The process for forming the bottom mask layer 240, the stop layer 250 and the initial lower mask layer 210 may be a chemical vapor deposition process.

In other embodiments, the bottom mask layer and the stop layer may not be formed.

Figure 6:
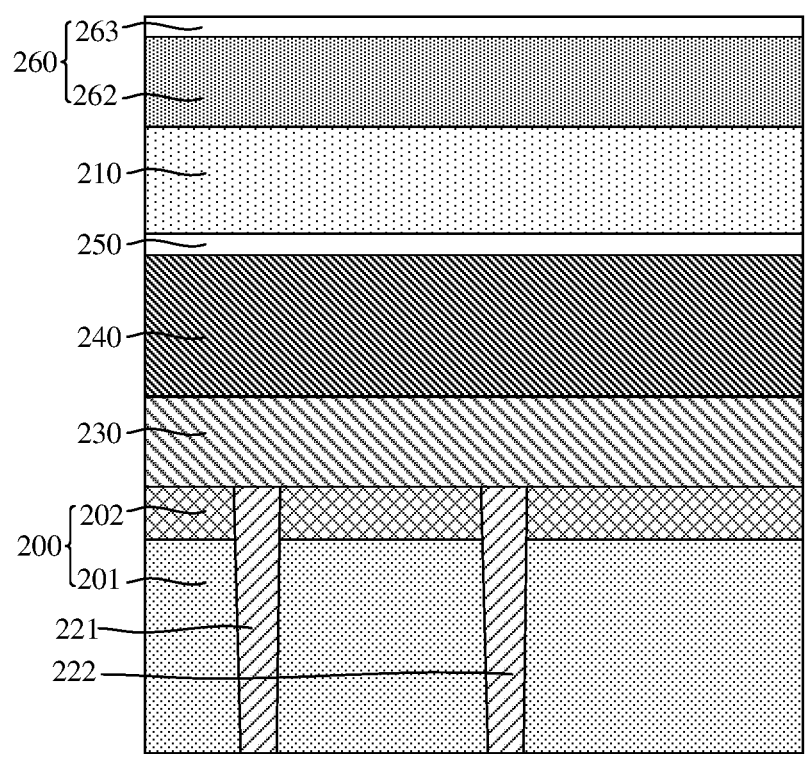
FIG. 6 is a second schematic structural diagram corresponding to operations in a method for manufacturing a semiconductor structure according to embodiments of this disclosure.
Figure 8:
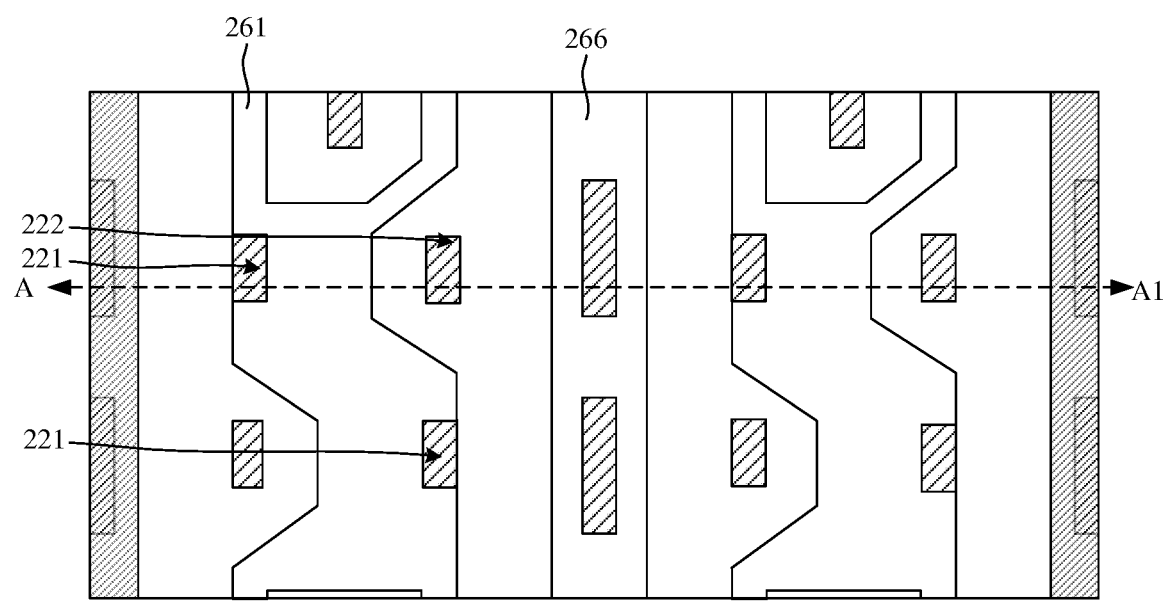
FIG. 8 is a fourth schematic structural diagram corresponding to operations in a method for manufacturing a semiconductor structure according to embodiments of this disclosure.

Referring to FIG. 6 and FIG. 8, a plurality of upper mask layers 26 discrete from each other are formed on the initial lower mask layer 210, and the upper mask layers 26 include an initial first pattern region 261. The initial first pattern region 261 has the same shape as the first pattern region formed subsequently.

Specifically, referring to FIG. 6, an initial upper mask layer 260 is formed on the initial lower mask layer 210, and covers the entire surface thereof.

In this embodiment, the initial upper mask layer 260 is a double-layer structure, which includes an initial first upper mask layer 262 and an initial second upper mask layer 263 that are stacked. The initial first upper mask layer 262 can resist reflection and standing waves, thereby improving pattern accuracy. In other embodiments, the initial upper mask layer may be a single-layer structure, for example, only including an initial first upper mask layer or an initial second upper mask layer.

The material of the initial first upper mask layer 262 may be silicon carbide, silicon carbonitride, silicon oxycarbide, or the like, and the material of the initial second upper mask layer 263 may be silicon nitride, silicon oxynitride, or the like. The initial first upper mask layer 262 and the initial second upper mask layer 263 may be formed by using a chemical vapor deposition process.

Figure 7:
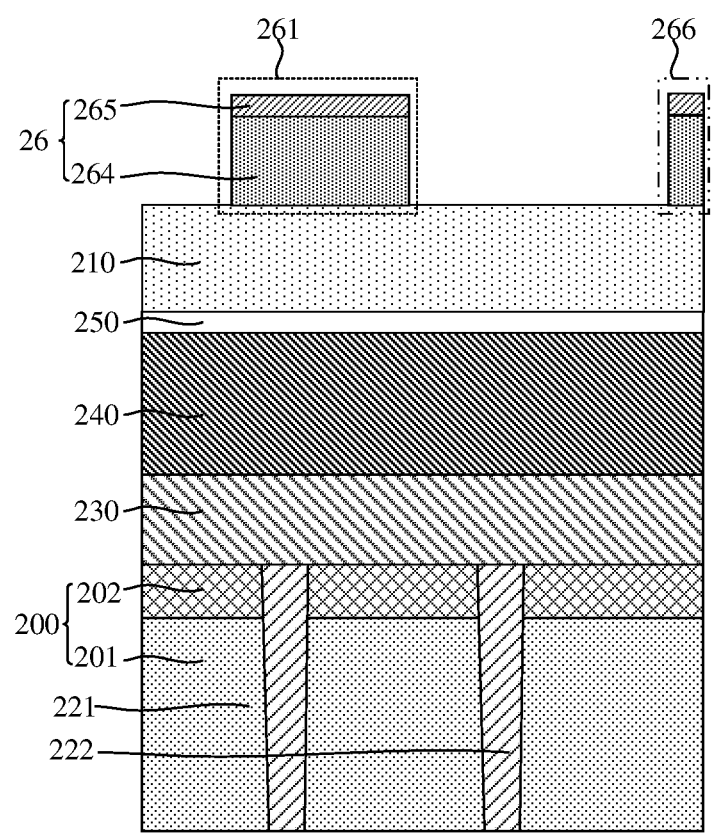
FIG. 7 is a third schematic structural diagram corresponding to operations in a method for manufacturing a semiconductor structure according to embodiments of this disclosure.

Referring to FIG. 7 and FIG. 8, FIG. 8 is a top view, and FIG. 7 is the partial cross-sectional view of FIG. 8 at the A-A1 direction. A part of the initial upper mask layer 260 (referring to FIG. 6) is etched, and the remaining initial upper mask layer 260 is used as the upper mask layers 26. The upper mask layers 26 include first upper mask layers 264 and second upper mask layers 265.

The upper mask layers 26 include the initial first pattern region 261. In this embodiment, the upper mask layers 26 further includes an initial third pattern region 266, and the space between the initial first pattern region 261 and the initial third pattern region 266 may be used to subsequently form an initial second pattern region. In other embodiments, the upper mask layer may only include the initial first pattern region, or may further include a pattern region other than the initial first pattern region and the initial third pattern region.

Further referring to FIG. 8, the orthographic projections of the two first contact layers 221 on the upper surface of the base 200 fall within the orthographic projection of the initial first pattern region 261 on the upper surface of the base 200. That is, one initial first pattern region 261 corresponds to two first contact layers 221.

Figure 9:
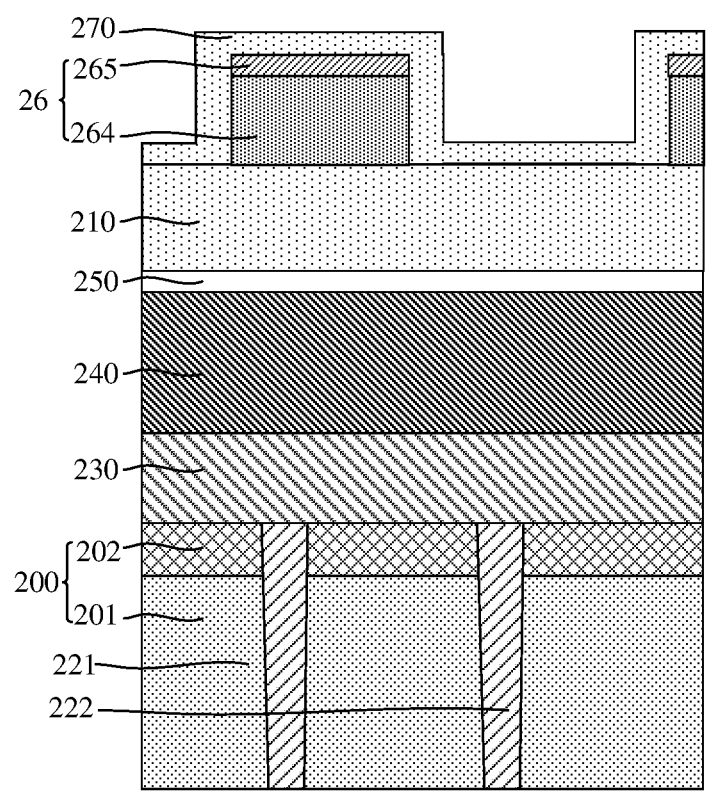
FIG. 9 is a fifth schematic structural diagram corresponding to operations in a method for manufacturing a semiconductor structure according to embodiments of this disclosure.
Figure 10:
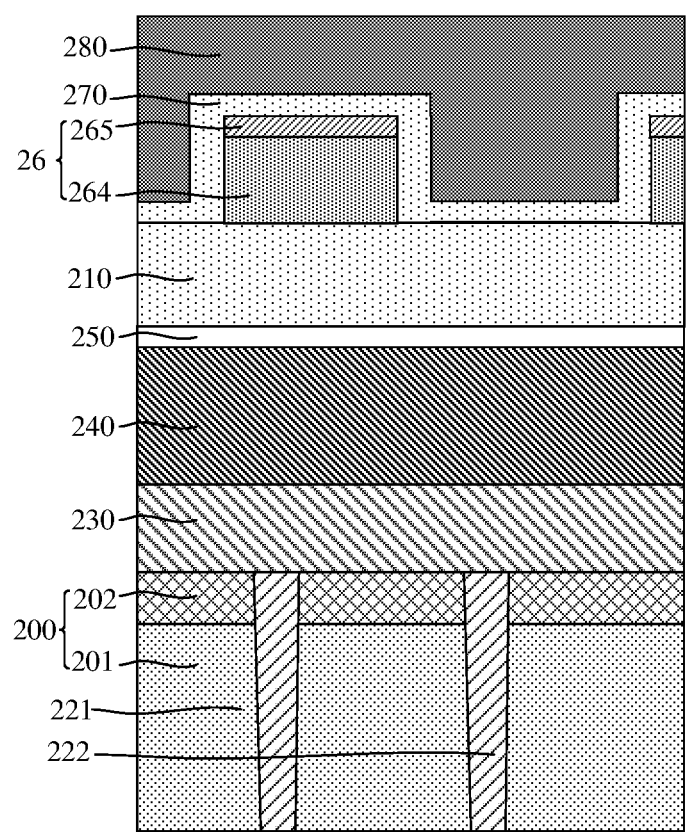
FIG. 10 is a sixth schematic structural diagram corresponding to operations in a method for manufacturing a semiconductor structure according to embodiments of this disclosure.
Figure 11:
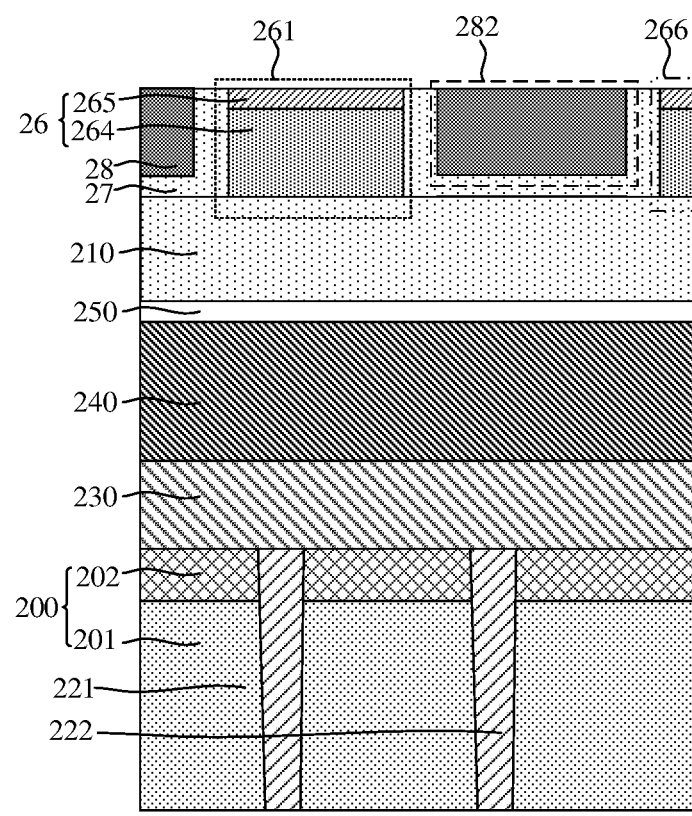
FIG. 11 is a seventh schematic structural diagram corresponding to operations in a method for manufacturing a semiconductor structure according to embodiments of this disclosure.

Referring to FIG. 9 to FIG. 11, sidewall layers 27 are formed on sidewalls of the upper mask layers 26. Sacrificial layers 28 are formed between adjacent upper mask layers 26, the sacrificial layers 28 are further in contact with the sidewall layers 27, and the sacrificial layers 28 include the initial second pattern region 282.

The following specifically describes the operation of forming the sidewall layers 27 and the sacrificial layers 28.

Referring to FIG. 9, an initial sidewall layer 270 is formed on the surfaces of the upper mask layers 26 and the upper surface of the initial lower mask layer 210 between adjacent upper mask layers 26. That is, the initial sidewall layer 270 is formed conformal covering on the upper mask layers 26 and the initial lower mask layer 210.

In this embodiment, the process for forming the initial sidewall layer 270 includes an atomic layer deposition process. The atomic layer deposition process can ensure that the initial sidewall layer 270 has a uniform thickness, thereby ensuring pattern accuracy of the subsequently formed first pattern region and second pattern region. The material of the initial sidewall layer 270 is different from the material of the upper mask layers 26, for example, the material of the initial sidewall layer 270 may be silicon oxide.

Referring to FIG. 10, an initial sacrificial layer 280 covering the initial sidewall layer 270 is formed. A process for forming the initial sacrificial layer 280 may be a chemical vapor deposition process. The material of the initial sacrificial layer 280 is different from the material of the initial sidewall layer 270, for example, the material of the initial sacrificial layer 280 may be silicon carbide or silicon nitride.

It can be learned from the foregoing that, in this embodiment, the initial sidewall layer 270 is not etched before the initial sacrificial layer 280 is formed. In this way, the production process can be simplified. In other embodiments, before the initial sacrificial layer is formed, the initial sidewall layer may be etched to remove the initial sidewall layer located on the upper surface of the initial lower mask layer and upper surfaces of the upper mask layers, so that the initial sidewall layer on the sidewalls of the upper mask layers is retained, and the retained initial sidewall layer is used as the sidewall layers.

Referring to FIG. 11, the initial sacrificial layer 280 and the initial sidewall layer 270 higher than the upper mask layers 26 are removed, the remaining initial sacrificial layer 280 (referring to FIG. 10) is used as the sacrificial layers 28, and the remaining initial sidewall layer 270 (referring to FIG. 10) is used as the sidewall layers 27. In this case, the sidewall layers 27 on the upper surface of the initial lower mask layer 210 and the sacrificial layers 28 constitute stacked structures.

In this embodiment, a part of the initial sacrificial layer 280 and a part of the initial sidewall layer 270 are etched by using a dry etching process.

The sacrificial layers 28 include the initial second pattern region 282, and the initial second pattern region 282 is adjacent to the initial first pattern region 261. In this embodiment, the initial second pattern region 282 is further located between the initial first pattern region 261 and the initial third pattern region 266. The orthographic projection of the second contact layer 222 on the upper surface of the base 200 falls within the orthographic projection of the initial second pattern region 282 on the upper surface of the base 200.

In this embodiment, the sacrificial layers 28 further include a pattern region other than the initial second pattern region 282. In other embodiments, a sacrificial layer may only include the initial second pattern region.

Figure 12:
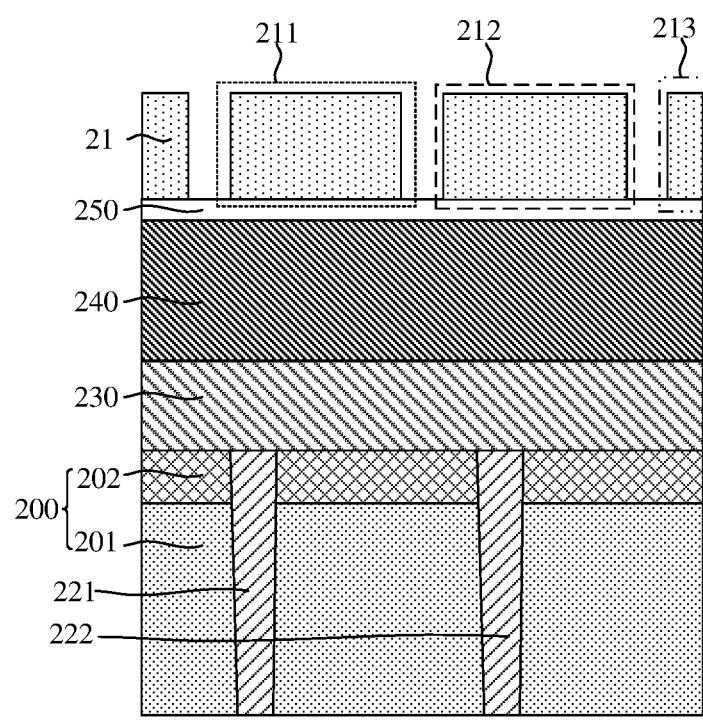
FIG. 12 is an eighth schematic structural diagram corresponding to operations in a method for manufacturing a semiconductor structure according to embodiments of this disclosure.
Figure 13:
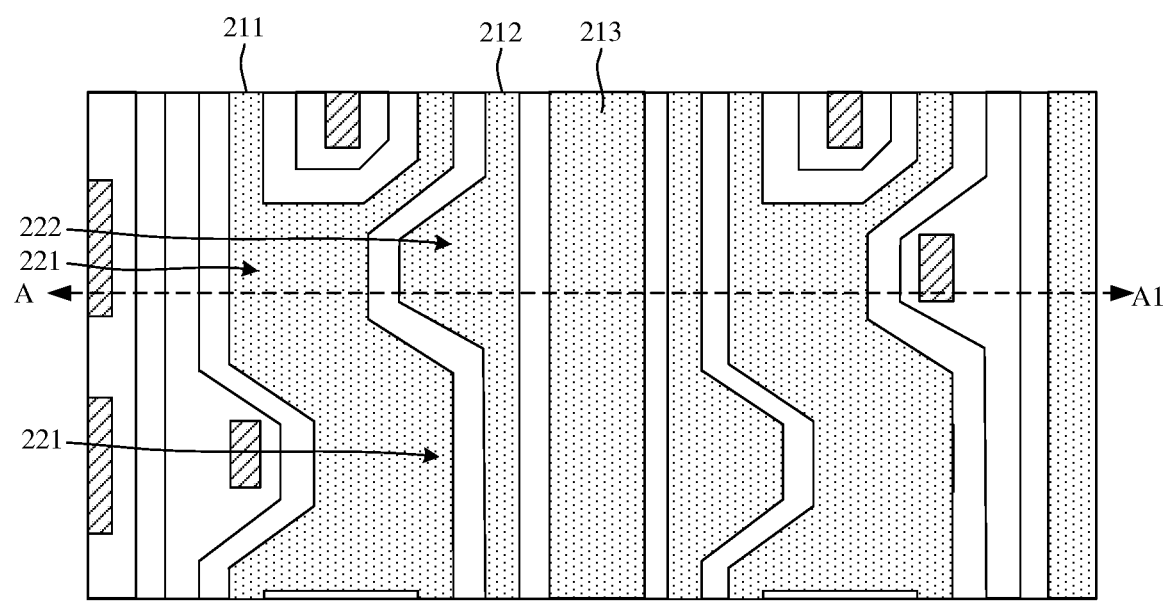
FIG. 13 is a ninth schematic structural diagram corresponding to operations in a method for manufacturing a semiconductor structure according to embodiments of this disclosure.

Referring to FIG. 12 and FIG. 13, FIG. 13 is a top view, and FIG. 12 is the partial cross-sectional view of FIG. 13 at the A-A1 direction. The sidewall layers 27 (referring to FIG. 11) located on the sidewalls of the upper mask layers 26 (referring to FIG. 11) are removed. The sidewall layers 27 on the upper surface of the initial lower mask layer 210 and the sacrificial layers 28 constitute stacked structures. The initial lower mask layer 210 is etched by using the upper mask layers 26 and the stacked structures as a mask, to form the lower mask layers 21. After the lower mask layers 21 are formed, the upper mask layers 26 and the stacked structures are removed.

It can be understood that, in other embodiments, the initial sidewall layer on the upper surface of the initial lower mask layer may be removed before the initial sacrificial layer is formed, and only the initial sidewall layer on the sidewalls of the upper mask layers is retained as the sidewall layers. Correspondingly, all of the sidewall layers are subsequently removed, and the initial lower mask layer is etched by using the upper mask layers and the sacrificial layers as a mask.

In this embodiment, the sidewall layers 27 on the sidewalls of the upper mask layers 26 may be removed by using a wet etching process. In other embodiments, a part of the sidewall layers may be removed by using dry etching.

It can be understood that, after the sidewall layers 27 on the sidewalls of the upper mask layers 26 is removed, the initial lower mask layer 210 (referring to FIG. 11) is etched, that is, patterns of the initial first pattern region 261 (referring to FIG. 11), the initial second pattern region 282 (referring to FIG. 11), and the initial third pattern region 266 are transferred to the initial lower mask layer 210 (referring to FIG. 11).

Still referring to FIG. 13, the lower mask layers 21 include at least the first pattern region 211 and the second pattern region 212, the first pattern region 211 corresponds to the initial first pattern region 261 (referring to FIG. 11), and the second pattern region 212 corresponds to the initial second pattern region 282 (referring to FIG. 11). In this embodiment, the upper mask layers 26 (referring to FIG. 11) further include the initial third pattern region 266 (referring to FIG. 11). Correspondingly, a third pattern region 213 is further formed after the initial lower mask layer 210 is etched.

Two first contact layers 221 are completely located right below one first pattern region 211, and one second contact layer 222 is completely located right below one second pattern region 212. It can be understood that when the first contact layers 221 are completely located right below the first pattern region 211 and the second contact layer 222 is completely located right below the second pattern region 212, the contact area between the first contact layers 221 and the subsequently formed first electrical connection layer is the largest, and the contact area between the second contact layer 222 and the subsequently formed second electrical connection layer is the largest, so that the contact resistance can be decreased.

Continuing referring to FIG. 13, in this embodiment, the first pattern region 211 is a merged region of the two subsequently formed first sub-pattern regions. Therefore, compared with single separate first sub-pattern region, the process window of the first pattern region 211 is larger. In this way, larger distance can be reserved for the second pattern region 212, that is, the area of the second pattern region 212 close to one side of the adjacent first pattern region 211 can be appropriately increased. That is, the second pattern region 212 may be closer to the first pattern region 211 than the second contact layer 222. That is, the distance between the second pattern region 212 and the first pattern region 211 may be less than the distance between the second contact layer 222 and the first pattern region 211. In this way, the volume of the subsequently formed second electrical connection layer can be increased, thereby reducing the resistance. In addition, the distance between the subsequently formed first electrical connection layer and the second contact layer 222 adjacent thereto can be kept in a relatively large range, thereby reducing the risk of short circuit.

Further, the distance between the first pattern region 211 and the second pattern region 212 adjacent to each other is 20 nm-30 nm, for example, 22 nm, 25 nm, or 27 nm. When the distance between the first pattern region 211 and the second pattern region 212 falls within the foregoing range, the distance between the second contact layer 222 and the subsequently formed first electrical connection layers can be increased, thereby avoiding short circuit.

It is to be noted that, in this embodiment, locations of the initial first pattern region 261 and the initial second pattern region 282 are successively defined by using the upper mask layers 26 and the sacrificial layers 28. In other embodiments, approximate locations of the first pattern region and the second pattern region may be first defined at one time, and a thin mask layer is formed on the sidewalls of the first pattern region and the second pattern region, so that sizes of the first pattern region and the second pattern region are adjusted more accurately.

Figure 14:
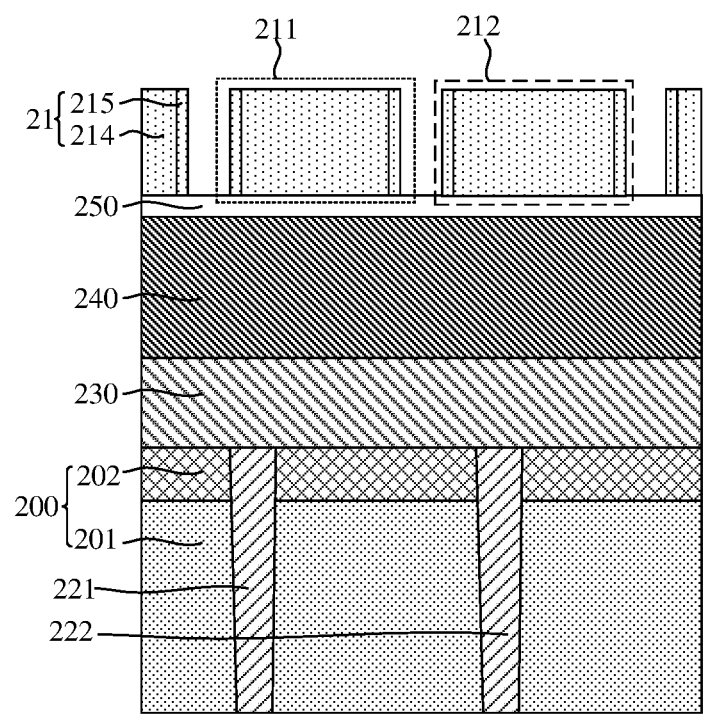
FIG. 14 is a tenth schematic structural diagram corresponding to operations in a method for manufacturing a semiconductor structure according to embodiments of this disclosure.

Specifically, referring to FIG. 14, the operations of forming the lower mask layers 21 includes: forming an initial lower mask layer on the initial electrical connection layer 240; etching the initial lower mask layer to form a plurality of first lower mask layers 214 discrete from each other; forming second lower mask layers 215 on the sidewalls of the first lower mask layers 214, where the second lower mask layers 215 and the first lower mask layers 214 constitute the lower mask layers 21. In other embodiments, the second lower mask layers may be further located on the upper surface of the first lower mask layers and the upper surface of the stop layer.

It is to be noted that, because the second lower mask layers 215 are used for implementing fine tuning on the sizes of the first pattern region 211 and the second pattern region 212, the second lower mask layers 215 should not be excessively thick.

In this embodiment, the material of the second lower mask layers 215 is the same as the material of the first lower mask layers 214, to ensure that rates of subsequent etching can be relatively consistent, thereby improving pattern accuracy. In other embodiments, the material of the second lower mask layers may be different from the material of the initial lower mask layer.

Referring to FIG. 15 to FIG. 18, the first pattern region 211 is patterned, that is, the segmenting processing is performed to the first pattern region 211, to form two first sub-pattern regions 2111 discrete from each other, in which one first sub-pattern region 2111 is located between the second pattern region 212 and the other first sub-pattern region 2111. On the upper surface of the base 200, the orthographic projection of one first contact layer 221 falls within the orthographic projection of corresponding one first sub-pattern region 2111.

The first sub-pattern region 2111 has the same shape as the subsequently formed first electrical connection layer. That is, after the first pattern region 211 is segmented, two separate first electrical connection layers may be subsequently formed by using the first sub-pattern regions 2111 as a mask.

The following describes in detail the operations of forming the first sub-pattern regions 2111.

Figure 15:
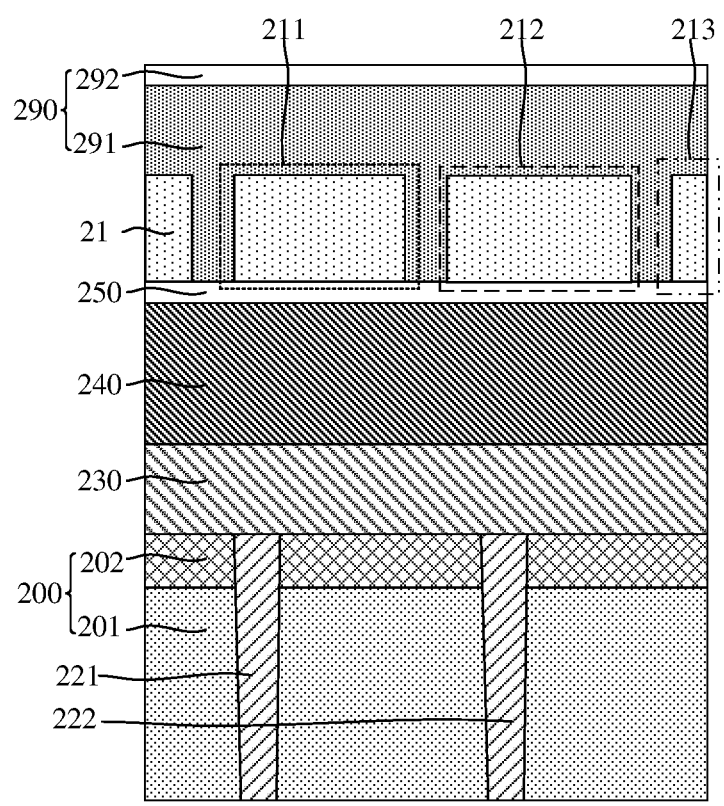
FIG. 15 is an eleventh schematic structural diagram corresponding to operations in a method for manufacturing a semiconductor structure according to embodiments of this disclosure.

Referring to FIG. 15, a middle mask layer 290 covering the lower mask layers is formed. In this embodiment, the middle mask layer 290 is a double-layer structure, and includes a first middle mask layer 291 and a second middle mask layer 292 that are stacked. The material of the first middle mask layer 291 may be silicon carbide, silicon carbonitride, silicon oxycarbide, or the like, and the material of the second middle mask layer 292 may be silicon nitride, silicon oxynitride, or the like. In other embodiments, the middle mask layer may be a single-layer structure.

Figure 16:
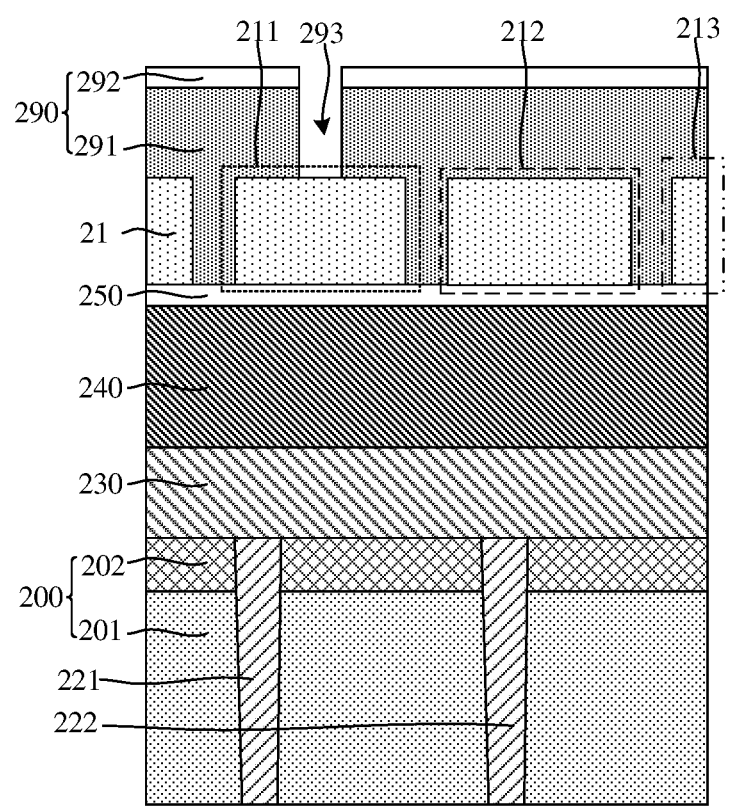
FIG. 16 is a twelfth schematic structural diagram corresponding to operations in a method for manufacturing a semiconductor structure according to embodiments of this disclosure.

Referring to FIG. 16, patterning processing is performed to the middle mask layer 290 to form an isolation channel 293 in the middle mask layer 290. In this embodiment, the isolation channel 293 is formed by using photolithography and etching processes.

Figure 17:
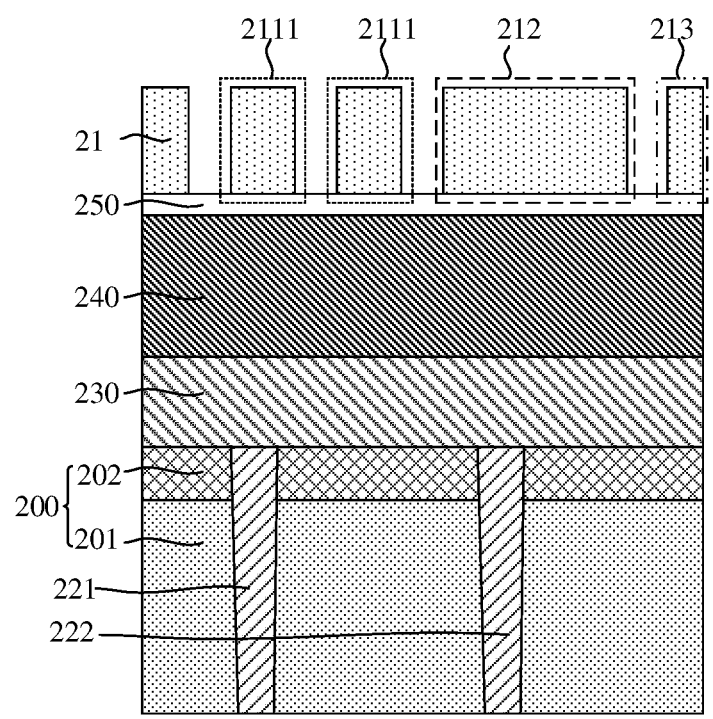
FIG. 17 is a thirteenth schematic structural diagram corresponding to operations in a method for manufacturing a semiconductor structure according to embodiments of this disclosure.
Figure 18:
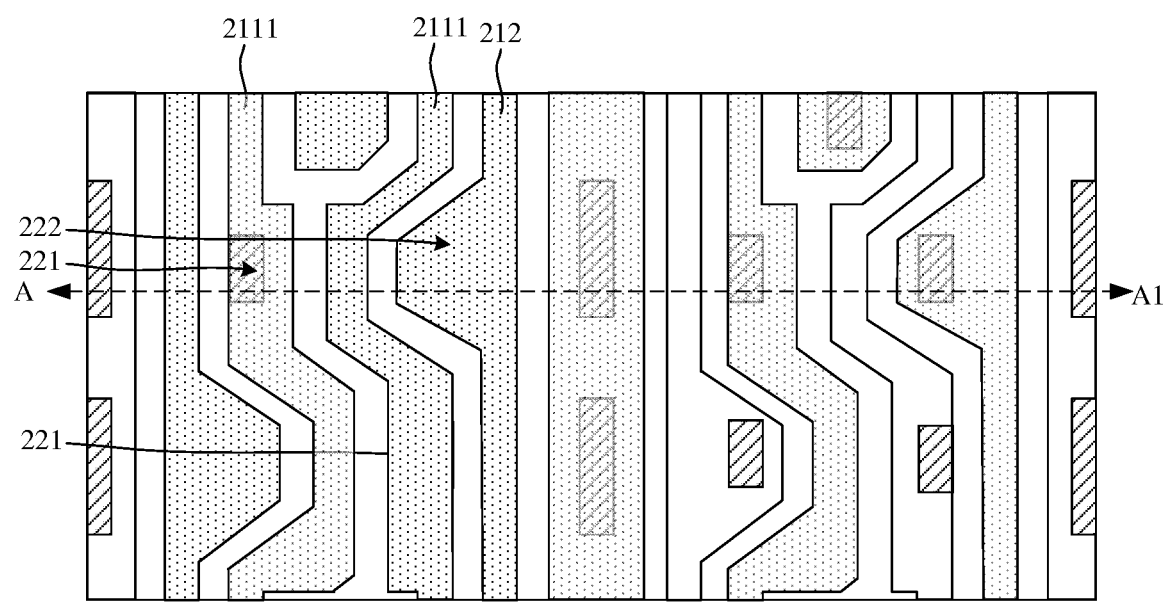
FIG. 18 is a fourteenth schematic structural diagram corresponding to operations in a method for manufacturing a semiconductor structure according to embodiments of this disclosure.

Referring to FIG. 17 and FIG. 18, FIG. 18 is a top view, and FIG. 17 is a partial cross-section of FIG. 18 at the A-A1 direction. The first pattern region 211 (referring to FIG. 16) is segmented along the isolation channel 293 (referring to FIG. 16) to form the first sub-pattern regions 2111.

In this embodiment, the part of the first pattern region 211 may be removed using a dry etching process. The removed part of the first pattern region 211 corresponds to the part of the initial electrical connection layer 230 that is subsequently removed. Because the part of the initial electrical connection layer 230 does not work, the performance of the semiconductor structure will not be affected after the part is removed.

Further, referring to FIG. 18, the orthographic projection of each first contact layer 221 on the upper surface of the base 200 (referring to FIG. 17) falls within one first sub-pattern region 2111. That is, one first contact layer 221 is completely located right below one first sub-pattern region 2111.

The distance between adjacent first sub-pattern regions 2111 is 30 nm-50 nm, for example, 32 nm, 46 nm. When the distance between two first sub-pattern regions 2111 falls within the foregoing range, it can be ensured that the distance between two subsequently formed first electrical connection layers is kept in a relatively large range, thereby avoiding short circuit therebetween, and avoiding excessively removal of the initial electrical connection layer. Therefore, it is ensured that the first electrical connection layer has a proper volume to reduce the resistance.

Figure 19:
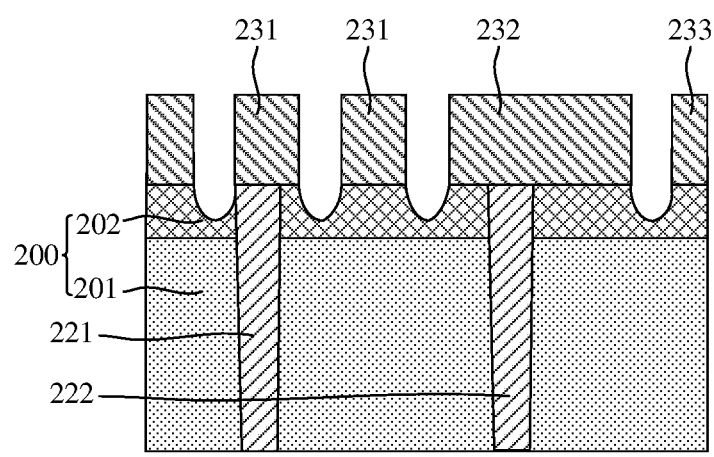
FIG. 19 is a fifteenth schematic structural diagram corresponding to operations in a method for manufacturing a semiconductor structure according to embodiments of this disclosure.

Referring to FIG. 19, patterns of the first sub-pattern regions 2111 and the second pattern region 212 are transferred to the initial electrical connection layer 230 (referring to FIG. 17). Specifically, the stop layer 250 (referring to FIG. 17), the bottom mask layer 240 (referring to FIG. 17), and the initial electrical connection layer 230 are sequentially etched by using the lower mask layers 21 (referring to FIG. 17) as a mask, to form the first electrical connection layers 231 and the second electrical connection layer 232 discrete from each other. Each first electrical connection layer 231 corresponds to one first sub-pattern region 2111 (referring to FIG. 18), and each second electrical connection layer 232 corresponds to one second pattern region 212 (referring to FIG. 18). The lower mask layers 21, the stop layer 250, and the bottom mask layer 240 are removed. In this embodiment, a third electrical connection layer 233 is also formed.

Each first electrical connection layer 231 is electrically connected to one first contact layer 221, and each second electrical connection layer 232 is electrically connected to one second contact layer 222. It is to be noted that, because FIG. 19 is a partial cross-sectional view, it does not show another first contact layer 221. In other cross section, the other first contact layer 221 is electrically connected to the first electrical connection layer 231.

Further, because there is a relatively large distance between the second contact layer 222 and the first electrical connection layer 231 adjacent thereto, short circuit is unlikely to occur between them. In addition, the space occupied by the second electrical connection layer 232 may be appropriately enlarged. Therefore, the second electrical connection layer 232 can completely cover the top surface of the second contact layer 222, which avoids removal of a part of the second contact layer 222 during etching, so as to avoid an increase of the contact resistance between the second contact layer 222 and the second electrical connection layer 232.

In view of the above, in this embodiment, patterns of the two first electrical connection layers 231 are first merged, that is, the first pattern region 211 is firstly formed. Because the first pattern region 211 has a larger process window, partial space can be reserved, so that the sizes and the locations of the first electrical connection layers 231 can be subsequently adjusted, thereby avoiding short circuit between the second contact layer 222 and the first electrical connection layer 231 adjacent thereto.

Another embodiment of this disclosure provides a semiconductor structure. The semiconductor structure provided in this embodiment may be manufactured by the method for manufacturing a semiconductor structure provided in the foregoing embodiments. FIG. 19 is a partial sectional view of the semiconductor structure provided in this embodiment. Referring to FIG. 19, the semiconductor structure includes a base 200, in which at least two first contact layers 221 and at least one second contact layer 222 discrete from each other are provided, and at least two first electrical connection layers 231 and at least one second electrical connection layer 232 discrete from each other are provided. One first electrical connection layer 231 is located between one second electrical connection layer 232 and another first electrical connection layer 231. On the upper surface of the base 200, the orthographic projection of each first contact layer 221 falls within the orthographic projection of one corresponding first electrical connection layer 231, and the orthographic projection of each second contact layer 222 falls within the orthographic projection of one corresponding second electrical connection layer 232. Each first electrical connection layer 231 is electrically connected to one corresponding first contact layer 221; and each second electrical connection layer 232 is electrically connected to one corresponding second contact layer 222. For parts in this embodiment that are the same as or similar to those in the foregoing embodiment, reference can be made to detailed descriptions of the foregoing embodiment, which are not described herein again.

The following provides a detailed description with reference to the accompanying drawings.

In this embodiment, the base 200 is a double-layer structure, and includes a substrate 201 and a covering layer 202.

The first contact layer 221 is completely located right below the first electrical connection layer 231, and the second contact layer 222 is completely located right below the second electrical connection layer 232. In this case, the contact area between the first contact layer 221 and the first electrical connection layer 231 is the area of the entire upper surface of the first contact layer 221, and thus the contact area therebetween is the largest. The contact area between the second contact layer 222 and the second electrical connection layer 232 is the area of the entire upper surface of the second contact layer 222, and thus the contact area therebetween is the largest. In this way, the contact resistances can be reduced.

In this embodiment, the semiconductor structure further includes a third electrical connection layer 233. In other embodiments, the semiconductor structure may only include first electrical connection layer and second electrical connection layer.

In this embodiment, in the arrangement direction of the first electrical connection layers 231, i.e., the horizontal direction, the widths of two first electrical connection layers 231 are the same. In other embodiments, the widths of the two first electrical connection layers may be different. When the difference between the widths of two first electrical connection layers 231 is kept within a relatively small range, the resistances of the two first electrical connection layers 231 are close, and the difference in electrical performances thereof is also relatively small.

The distance between two adjacent first electrical connection layers 231 is 30 nm-50 nm, for example, 35 nm, 48 nm. When the distance between adjacent first electrical connection layers 231 is kept in the foregoing range, it can be ensured that there is a sufficient distance between the two first electrical connection layers 231 to avoid short circuit therebetween.

A distance between the first electrical connection layer 231 and the second electrical connection layer 232 which are adjacent to each other is 20 nm-30 nm, for example, may be 22 nm, 24 nm, or 29 nm. When the distance between the first electrical connection layer 231 and the second electrical connection layer 232 which are adjacent to each other is kept in the foregoing range, it can be ensured that there is a sufficient distance between the first electrical connection layer 231 and the second electrical connection layer 232 to avoid short circuit therebetween.

In this embodiment, the distance between the first electrical connection layer 231 and the second electrical connection layer 232 which are adjacent to each other is less than the distance between the first electrical connection layer 231 and the second contact layer 222 which are adjacent to each other. That is, the distance between the first electrical connection layer 231 and the second contact layer 222 which are adjacent to each other is relatively large, so that the risk of short circuit therebetween can be reduced. In other embodiments, the distance between the first electrical connection layer and the second electrical connection layer which are adjacent to each other may be equal to the distance between the first electrical connection layer and the second contact layer which are adjacent to each other. Specifically, in the arrangement direction of the first electrical connection layers 231, i.e., in the horizontal direction, the distance between the first electrical connection layer 231 and the second contact layer 222 which are adjacent to each other is between 20 nm and 55 nm, for example, 27 nm, 36 nm, or 45 nm. In view of the above, in this embodiment, the orthographic projection of each first contact layer 221 falls within the orthographic projection of one first electrical connection layer 231, and the orthographic projection of each second contact layer 222 falls within the orthographic projection of one second electrical connection layer 232. In this way, the contact resistance is relatively small. In addition, the distance between the second contact layer 222 and the first electrical connection layer 231 is large, so that the risk of short circuit therebetween is small.

A person of ordinary skill in the art may understand that the foregoing implementations are specific embodiments of this disclosure. In practical application, various forms and details may be changed without departing from the spirit and scope of this disclosure. Any person skilled in the art may make a change or modification without departing from the spirit and scope of this disclosure. Therefore, the scope of protection of this disclosure shall be subject to the scope of the claims.

In the embodiments of this disclosure, a lower mask layer including a first pattern region and a second pattern region is formed; segmenting processing is performed to the first pattern region to form two first sub-pattern regions discrete from each other; on the upper surface of a base, the orthographic projection of one first contact layer falls within the orthographic projection of one first sub-pattern region; and an initial electrical connection layer is etched by using the lower mask layer as a mask, to form first electrical connection layers and a second electrical connection layer, in which the first electrical connection layers correspond to the first sub-pattern regions, and the second electrical connection layer corresponds to the second pattern region. That is, the first pattern region that covers patterns of the two first electrical connection layers is first formed. Compared with a pattern corresponding to only one first electrical connection layer, the first pattern region has a larger process window, so that sufficient space can be reserved for the first electrical connection layer that is prone to short circuit, to increase the distance between the first electrical connection layer and the second contact layer adjacent thereto.

In addition, the distance between the first pattern region and the second pattern region which are adjacent to each other is 20 nm-30 nm. When the distance between the first pattern region and the second pattern region falls within the foregoing range, the distance between the second contact layer and the subsequently formed first electrical connection layer can be increased, thereby avoiding short circuit.

What is claimed is:

1. A method for manufacturing a semiconductor structure, comprising:

providing a base, in which at least two first contact layers and at least one second contact layer discrete from each other are provided;

forming an initial electrical connection layer, which is electrically connected to the first contact layers and the second contact layer;

forming a lower mask layer, wherein the lower mask layer comprises at least one first pattern region and at least one second pattern region discrete from each other, in which the first pattern region is adjacent to the second pattern region, and on an upper surface of the base, orthographic projections of two first contact layers fall within an orthographic projection of one first pattern region, and an orthographic projection of one second contact layer falls within an orthographic projection of one second pattern region;

patterning the first pattern region to form two first sub-pattern regions discrete from each other, wherein one first sub-pattern region is arranged between the second pattern region and another first sub-pattern region, and on the upper surface of the base, an orthographic projection of one first contact layer falls within an orthographic projection of one first sub-pattern region; and etching the initial electrical connection layer by using the lower mask layer as a mask, to form at least two first electrical connection layers and at least one second electrical connection layer discrete from each other, wherein each first electrical connection layer corresponds to each first sub-pattern region and is electrically connected to corresponding first contact layer, and each second electrical connection layer corresponds to each second pattern region and is electrically connected to corresponding second contact layer.

2. The method for manufacturing a semiconductor structure of claim 1, wherein the step of forming the lower mask layer comprises:

forming an initial lower mask layer on the initial electrical connection layer;

forming an upper mask layer comprising at least one initial first pattern region on the initial lower mask layer;

forming sidewall layers on sidewalls of initial first pattern regions in the upper mask layer;

forming a sacrificial layer between adjacent initial first pattern regions in the upper mask layer, wherein the sacrificial layer is further in contact with the sidewall layer, and the sacrificial layer comprises an initial second pattern region;

removing the sidewall layers; and etching the initial lower mask layer by using the upper mask layer and the sacrificial layer as a mask, to form the lower mask layer, wherein the first pattern region corresponds to the initial first pattern region, and the second pattern region corresponds to the initial second pattern region.

3. The method for manufacturing a semiconductor structure of claim 2, wherein the step of forming the sacrificial layer comprises:

forming an initial sidewall layer on surface of the upper mask layer and an upper surface of the initial lower mask layer between adjacent initial first pattern regions in the upper mask layer;

forming an initial sacrificial layer covering the initial sidewall layer; and removing the initial sacrificial layer and the initial sidewall layer higher than the upper mask layer, wherein the remaining initial sacrificial layer serves as the sacrificial layer, and the remaining initial sidewall layer serves as the sidewall layers;

and the step of removing the sidewall layers specifically comprises:
removing the sidewall layers on the sidewalls of the upper mask layer; and
retaining the sidewall layers on the upper surface of the initial lower mask layer, wherein the sidewall layers on the upper surface of the initial lower mask layer and the sacrificial layer constitute a stacked structure;
and the step of etching the initial lower mask layer by using the upper mask layer and the sacrificial layer as a mask specifically comprises:
etching the initial lower mask layer by using the upper mask layer and the stacked structure as the mask.

4. The method for manufacturing a semiconductor structure of claim 3, wherein
a process for forming the initial sidewall layer comprises an atomic layer deposition process.

5. The method for manufacturing a semiconductor structure of claim 1, wherein
the step of forming the lower mask layer comprises:
forming an initial lower mask layer on the initial electrical connection layer; etching the initial lower mask layer to form a plurality of first lower mask layers discrete from each other; and
forming second lower mask layers on sidewalls of the first lower mask layers, wherein the second lower mask layers and the first lower mask layers constitute the lower mask layer.

6. The method for manufacturing a semiconductor structure of claim 5, wherein
a material of the second lower mask layer is the same as a material of the initial lower mask layer.

7. The method for manufacturing a semiconductor structure of claim 1, wherein
the step of patterning the first pattern region comprises:
forming a middle mask layer covering the lower mask layer;
performing patterning processing to the middle mask layer to form trench in the middle mask layer; and
cutting the first pattern region along the trench to form the two first sub-pattern regions.

8. The method for manufacturing a semiconductor structure of claim 1, wherein
a distance between adjacent first sub-pattern regions is 30 nm-50 nm.

9. The method for manufacturing a semiconductor structure of claim 1, wherein
a distance between the first pattern region and the second pattern region adjacent to each other is 20 nm-30 nm.

10. The method for manufacturing a semiconductor structure of claim 2, further comprising:
forming a bottom mask layer on the initial electrical connection layer, and
forming a stop layer on the bottom mask layer; wherein the initial lower mask layer is arranged on the stop layer.

11. The method for manufacturing a semiconductor structure of claim 2, wherein
the upper mask layer further comprises at least one initial third pattern region, and the initial second pattern region is arranged between the initial first pattern region and the initial third pattern region.

12. The method for manufacturing a semiconductor structure of claim 11, wherein
the lower mask layer further comprises at least one third pattern region corresponding to the initial third pattern region;
and the step of etching the initial electrical connection layer by using the lower mask layer as a mask to form at least two first electrical connection layers and at least one second electrical connection layer discrete from each other further comprises:
forming at one third electrical connection layer corresponding to the third pattern region.

13. The method for manufacturing a semiconductor structure of claim 1, wherein
the lower mask layer is formed by a process of Self-aligned Double Patterning.

14. The method for manufacturing a semiconductor structure of claim 1, wherein
the initial electrical connection layer, the first contact layer, and the second contact layer are formed in one step, and a material of the initial electrical connection layer is the same as a material of the first contact layer and a material of the second contact layer.

15. The method for manufacturing a semiconductor structure of claim 1, wherein
in a horizontal direction, a distance between the second pattern region and the first pattern region is less than a distance between the second contact layer and the first pattern region.

* * * * *